(12) United States Patent
Twitchen et al.

(10) Patent No.: US 9,157,170 B2
(45) Date of Patent: Oct. 13, 2015

(54) SINGLE CRYSTAL DIAMOND MATERIAL

(75) Inventors: Daniel James Twitchen, Bracknell (GB); Harpreet Kaur Dhillon, Maidenhead (GB); Geoffrey Alan Scarsbrook, Ascot (GB)

(73) Assignee: Element Six Technologies Limited, Didcot (GB)

( * ) Notice: Subject to any disclaimer, the term of this patent is extended or adjusted under 35 U.S.C. 154(b) by 319 days.

(21) Appl. No.: 12/968,705

(22) Filed: Dec. 15, 2010

(65) Prior Publication Data
US 2011/0150745 A1    Jun. 23, 2011

Related U.S. Application Data

(60) Provisional application No. 61/288,553, filed on Dec. 21, 2009.

(51) Int. Cl.
*C30B 25/20* (2006.01)
*C30B 29/04* (2006.01)

(52) U.S. Cl.
CPC .................. *C30B 25/20* (2013.01); *C30B 29/04* (2013.01)

(58) Field of Classification Search
None
See application file for complete search history.

(56) References Cited

U.S. PATENT DOCUMENTS

| 6,096,129 A | 8/2000 | Saito et al. |
| 2004/0177803 A1* | 9/2004 | Scarsbrook et al. ............ 117/68 |

FOREIGN PATENT DOCUMENTS

| EP | 1 553 215 A2 | 7/2005 |
| EP | 1 707 654 A1 | 10/2006 |
| JP | H04-139091 A | 5/1992 |
| JP | 6 087691 A | 3/1994 |
| JP | H11-001392 A | 1/1999 |
| JP | 2004-284482 A | 10/2004 |
| JP | 2006-508881 A | 3/2006 |
| JP | 2009-137779 A | 6/2009 |
| WO | 03/052177 A1 | 6/2003 |
| WO | 2004/027123 A1 | 4/2004 |

OTHER PUBLICATIONS

Gaukroger et al.; X-ray Topography Studies of dislocations in Single Crystal CVD Diamond; Diamond & Related Materials; 17, pp. 262-269; Dec. 23, 2007.*
PCT Search Report for PCT/EP2010/069825 dated Feb. 9, 2011.
Hutchings, I.M., "Tribology: Friction and Wear of Engineering Materials," Pub. Edward Arnold (London), 1992, 8-9.
Silva, et al., "High quality, large surface area, homoepitaxial MPACVD diamond growth," Diamond and Related Materials, 18 (2009) 683-697.

* cited by examiner

*Primary Examiner* — Guinever S Gregorio
(74) *Attorney, Agent, or Firm* — Dean W. Russell; Kilpatrick Townsend & Stockton LLP

(57) ABSTRACT

A method of producing a grown single crystal diamond substrate comprising:
(a) providing a first diamond substrate which presents a (001) major surface, which major surface is bounded by at least one <100> edge, the length of the said at least one <100> edge exceeding any dimension of the surface that is orthogonal to the said at least one <100> edge by a ratio of at least 1.3:1; and
(b) growing diamond material homoepitaxially on the (001) major surface of the diamond material surface under chemical vapour deposition (CVD) synthesis conditions, the diamond material growing both normal to the major (001) surface, and laterally therefrom.

22 Claims, 6 Drawing Sheets

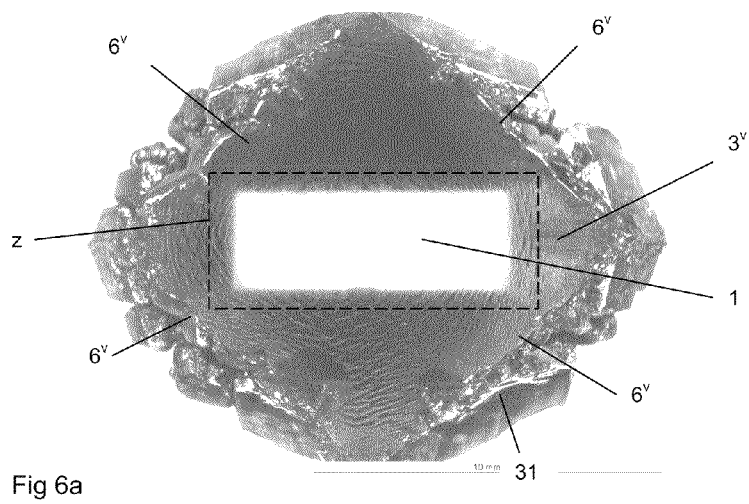
Fig 6a
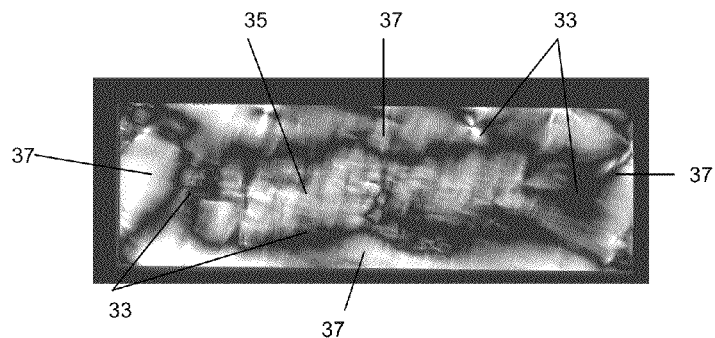
Fig 6b
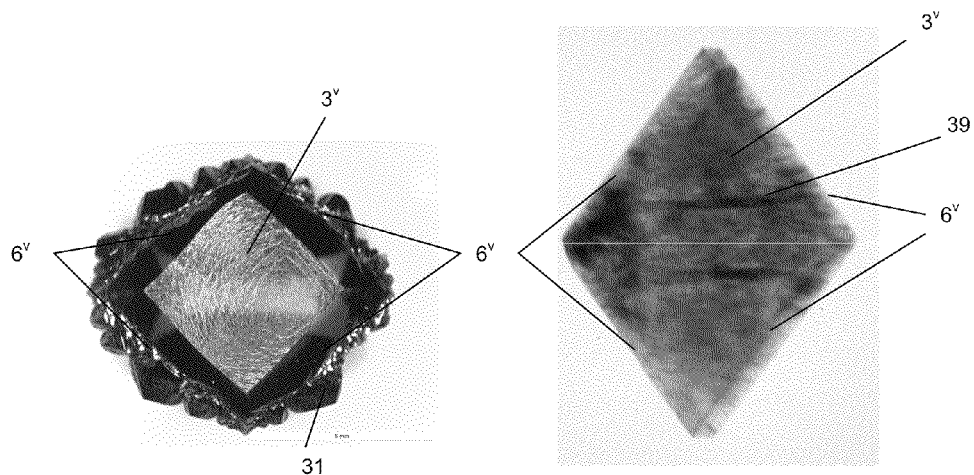
Fig 6c
Fig 6d

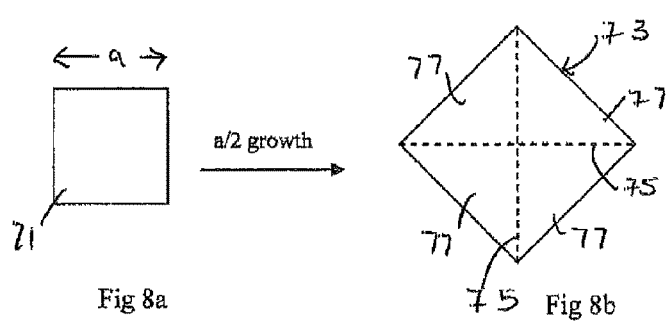
Fig 8a
Fig 8b
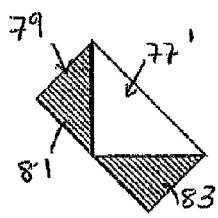
Fig 8c
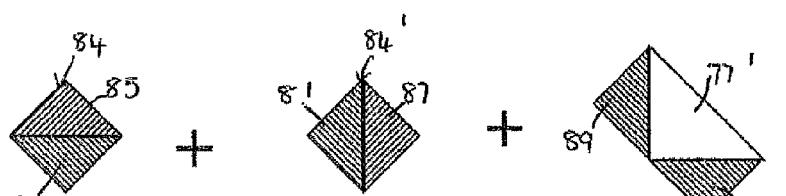
Fig 8d

SINGLE CRYSTAL DIAMOND MATERIAL

This invention relates to a method of growing single crystal diamond material by chemical vapour deposition (CVD), and to grown CVD diamond material per se.

Diamond material offers a range of unique properties, including optical transmission, thermal conductivity, stiffness, wear resistance and its electronic properties. Whilst many of the mechanical properties of diamond material can be realised in more than one type of diamond material, other properties are very sensitive to the type of diamond material used. For some applications, e.g. for the best electronic properties, the use of single crystal diamond material grown by CVD may be preferred, when it may outperform polycrystalline diamond material grown by CVD, diamond material made by the known high pressure-high temperature (HPHT) technique, and natural diamond.

Growing single crystal diamond material by a CVD process typically involves growing diamond material homoepitaxially onto an existing diamond plate. This process is known as "CVD homoepitaxial synthesis", and is well known in the prior art. It typically involves feeding varying amounts of gases, including a carbon source, into a chamber, and energising the gases, and providing conditions so that a plasma of carbon is created on top of the existing diamond plate, onto which carbon atoms from the plasma deposit to form diamond material. Typically the existing diamond plate which is to act as a base substrate onto which CVD diamond material is grown is, or is cut from, a natural diamond material, or it is, or is cut from, a manufactured HPHT diamond plate. Usually this existing diamond plate is placed on a substrate carrier typically formed from molybdenum, tungsten, silicon or silicon carbide in the CVD growth chamber.

The diamond base substrate typically comprises a first major face which is presented to the growth process and onto which growth occurs. By the term "face" we mean a surface which is flat or substantially flat. The face onto which growth occurs is called the "growth face" of the base substrate. Typically, although not necessarily, the base substrate is a plate, which comprises a second major face which is largely parallel to the first major face and separated from it by a perpendicular distance which is the plate thickness, said plate thickness typically being smaller, usually substantially smaller, than the lateral dimensions of the major faces. The second major face provides a convenient means of mounting the base substrate in order to present the first major face to the growth process. A major face is one where two orthogonal dimensions lying in the face, a,b (a≥b) can be found which, compared to any two orthogonal dimensions in any other face, $a_1 b_1$ ($a_1 \geq b_1$), satisfy the requirement (a≥$a_1$) and (b≥$b_1$). In this specification two dimensions are deemed approximately equal when the smaller is within 5% of the larger.

The growth face of naturally occurring and HPHT diamond base substrates may have any shape. When we talk about the shape of the growth face of a diamond base substrate we are referring to the two dimensional outline of the face formed by the periphery surface, the periphery surface being formed by the intersection of other surfaces with the growth surface. A HPHT diamond base substrate, may for example, be rectangular in shape having four <100> edges. As used herein the term "rectangular" encompasses square. As an alternative, an HPHT diamond base substrate may, for example, be octagonal with four <100> edges separated by four <110> sides, which may be the same or different length from the <100> edges. Sometimes corners or edges of naturally occurring diamond or HPHT diamond base substrates may be damaged or missing. Typically naturally occurring diamond or HPHT diamond base substrates suitable for use as CVD substrates present a major face for growth which is a few mm in each dimension, for example having shortest and longest dimensions in the range 1 to 8 mm.

In the known CVD processes the growth face of the base substrate may be in a variety of crystallographic orientations. The most usual orientation that is used for growth of high quality CVD diamond material is generally a plane defined by the Miller indices (001). Throughout this specification, the Miller indices {hkl}, defining a plane based on the axes x, y and z will be written assuming that the z direction is that normal or within 15° or within 10° or within 6°, or within 3° of the normal to the growth face of the base substrate and parallel to the growth direction. The axes x and y are then within the plane of the growth face of the base substrate, and are generally equivalent by symmetry.

During homoepitaxial single crystal growth, the material formed by growth on any particular crystallographically oriented surface is generally referred to as the "growth sector" for that surface. For example, material formed by growth on an (001) surface is referred to as the (001) growth sector.

During a CVD diamond material process there is homoepitaxial single crystal growth from the major growth surface (typically the (001) surface). This growth occurs not only normal to the growth surface of the base substrate but may also extend laterally therefrom. Therefore as the growth process takes place there is both thickening of the CVD grown diamond layer and also lateral extension of the grown diamond layer relative to the base diamond substrate. The lateral growth may be the same growth sector as the major growth surface (in the usual case the (001) growth sector) which is then enlarged in lateral area relative to that of the growth surface of the base substrate. Alternatively the lateral growth may be other growth sectors, such as the {113}. Whether or not the lateral growth is the same growth sector or a different growth sector from the major growth surface depends on the growth conditions.

In addition to homoepitaxial single crystal growth from the major growth surface, there is also homoepitaxial single crystal growth from the side surfaces of the base substrate. Thus, for the typical case where the growth surface is a (001) surface, growth occurs not only on the (001) face but also on the side surfaces, which may, in the case of a square or rectangular surface, for example, be {100} surfaces. The growing diamond single crystal is typically continuous across the growth sector boundary between areas of growth formed by different growth facets.

U.S. Pat. No. 6,096,129 describes a method of growing diamond material on a substrate surface such that the grown diamond material has a larger area than the starting substrate. The reference describes providing an initial single crystalline diamond base material, onto which single crystalline diamond material is homoepitaxially vapour deposited to provide a resulting diamond material that is cut and polished to provide a successive base material onto which single crystalline material is again grown, thereby forming a single crystalline diamond material having a large area. As best exemplified in FIGS. 4A-4C of U.S. Pat. No. 6,096,129, the initial base material is substantially square with {100} side surfaces, growth taking place predominantly on an upper {001} surface, that growth taking place laterally as well as normally from the upper {001} surface so that the grown surface has enlarged lateral dimensions compared to those of the initial base material. The successive base material that is cut from the grown diamond material is square in cross-section. The sides of the square are rotated 45° relative to the sides of the initial base material, and has <110> edges. The area of the square cross section of the successive base material is less than twice the area of the square cross-sectional area of the initial base material, due to the encroachment of {111} faces in the grown diamond material. This successive base material is then used for further growth, this further growth being from the <110> edges. The preferred growth rate ratio α (as defined by the ratio [√3×growth rate in <001>]÷[growth rate in <111>]) is said to be at least 3:1.

WO 2004/027123 (Element Six Ltd) describes an alternative method of producing a plate of single crystal diamond material from CVD diamond material grown on a substrate, which grown plate may be larger than the starting substrate. The method comprises severing the homoepitaxial CVD grown diamond material, and the substrate on which it was grown, transverse to the surface of the substrate on which the diamond material growth took place to produce a plate of single crystal CVD diamond material.

A first aspect of the present invention provides a method of growing a single crystal diamond material comprising:
(a) providing a first diamond substrate which presents a (001) major surface, which major surface is bounded by at least one <100> edge, the length of the said at least one <100> edge exceeding any dimension of the surface that is orthogonal to the said at least one <100> edge by a ratio of at least 1.3:1; and
(b) growing diamond material homoepitaxially on the (001) major surface of the diamond material surface under chemical vapour deposition (CVD) synthesis conditions, the diamond material growing both normal to the major (001) surface, and laterally therefrom.

According to the method of the present invention the first diamond substrate provides a base substrate presenting a major face for growth (the growth surface). The growth surface is an (001) surface which has at least one edge forming part of the periphery of the growth surface which is essentially linear and oriented along a <100> direction, and the length of which exceeds any other perpendicular dimension lying within the growth surface (and thus also a <100> direction) by a ratio exceeding 1.3:1, alternatively written as 1.3. When we say the at least one <100> edge exceeds "any" other perpendicular dimension we mean "each and every" other dimension perpendicular to the said at least one edge. So the at least one edge in the <100> direction is at least 1.3 times as long as the longest dimension (in the said surface) perpendicular to the at least one <100> edge.

The ratio of the length of the at least one <100> edge (of the substrate surface) to its longest perpendicular dimension is referred to in this specification as the aspect ratio of the surface. This term is used regardless of the shape of the substrate surface. For a rectangular substrate surface with side lengths a, b (where a>b) the aspect ratio is a/b. The aspect ratio of the first substrate used in the method of the invention, being at least 1.3:1, is substantially higher than those used in CVD growth processes described hitherto, where square faced substrates (i.e. those having an aspect ratio of 1) were typically used.

Preferably, the first substrate presents a major face for growth which has at least 3 edges forming part of the periphery of the growth surface, where each of those edges is essentially linear and oriented along either <100> or <110> directions. More preferably, the first substrate presents a major face for growth which has at least 4 edges forming part of the periphery of the growth surface comprising two parallel pairs of orthogonal <100> edges. More preferably these two parallel pairs of orthogonal <100> edges are the only edges present.

As noted above, we refer to the aspect ratio of the first substrate used in the method of the invention as the ratio of an edge (typically the longest edge) forming part of the periphery of the growth surface which is essentially linear and oriented along a <100> direction, to the longest perpendicular dimension lying within the growth plane face (and thus also a <100> direction). This aspect ratio according to our invention is at least 1.3:1.

The aspect ratio of the first substrate of this invention is at least 1.3:1 and preferably exceeds 1.3:1, or exceeds 1.5:1, or exceeds 1.7:1, or exceeds 2:1 or exceeds 2.5:1 or exceeds 3:1 or exceeds 4:1, and may even exceed 5:1 or more.

The first substrate may be in the form of a plate, with a second major surface parallel to the major surface forming the growth surface, the second major surface forming the rear face of the substrate. Alternatively the rear face(s) of the first substrate may have a more complex geometry. For convenience, further references will generally be to the specific geometry of a plate, but it should be noted that in its broadest aspect this invention includes circumstances where the surfaces of the substrate other than the major face forming the growth surface do not include a second major face parallel to the growth surface.

As used herein, the face referred to by phrases such as the term "major (001) surface" or "a major face for growth (the growth surface) which is a {001} surface" may be a surface which has an orientation which is exactly (001), which is advantageous, but it may also be a surface wherein the normal to that surface is up to 15°, preferably up to 10°, more preferably up to 6°, more preferably up to 3° off the [001] direction. Likewise, reference to the <100> directions lying in the plane of the major (001) surface may not be exactly <100> but the nearest direction to the relevant <100> that does lie within the plane of the major surface, and which is no more than 15°, preferably no more than 10°, preferably no more than 6°, more preferably no more than 3°, off the relevant <100> direction.

When we talk about growth laterally from the major growth surface it is understood that such lateral growth is associated with the vertical growth from the major growth surface (by which we mean growth normal to the major growth surface), i.e. the lateral growth of the "growth sector of the major surface" is associated with the thickening of that growth sector. The CVD single crystal diamond material grown by the method according to the first aspect of the invention is defined, for convenience, in the present specification, as having two distinct regions, as follows: the material that extends above the plane of the substrate surface on which growth takes place and outside of the peripheral boundary of the original substrate (as viewed along the direction normal to the major growth face of the substrate) is referred to as the "lateral growth region"; and that which extends above the original substrate (i.e. confined within the peripheral boundary of the original substrate as viewed along the direction normal to the major growth face of the substrate) as the "substrate growth region". This lateral growth region can be distinguished from any laterally extending growth occurring as a result of carbon depositing directly on the side surfaces of the first diamond substrate during the CVD process, as it lies above (i.e. in the growth direction) the plane defined by the original major growth face.

The object formed by CVD diamond material growth onto the first substrate is herein described as a grown CVD diamond material. It may alternatively be referred to as a grown CVD diamond stone.

The present invention is a departure from the prior art, and recognises for the first time that under specific CVD synthesis conditions CVD growth to provide a diamond material with enhanced lateral dimensions compared to those of a starting substrate can be achieved from a base substrate having a growth surface with a higher aspect ratio (as hereinbefore discussed and defined) than has been used hitherto, specifically with an aspect ratio of at least 1.3:1. It recognises that under appropriate conditions the use of such a starting substrate is neither detrimental nor problematic. Hitherto normal practice has been to use the largest starting substrate available, or where a cut is made, to cut out the largest possible substrate in which the two largest orthogonal <100> dimensions lying in the plane of the major growth surface are similar (i.e. their ratio is significantly less than 1.3:1. More typically the substrate used in prior art has been essentially square, i.e. with an aspect ratio of 1, sometimes with one or more missing corners.

In a preferred embodiment, the provided first diamond substrate presents a (001) major surface, which major surface is bounded by at least one <100> edge, and the method comprises growing diamond material homoepitaxially on the (001) major surface of the diamond material, growth being continued in one or more steps until there is a sufficient thickness of grown diamond material that the associated lateral growth of the diamond material is sufficiently great that full effective rotation of the said (001) major surface of the diamond material is achieved.

By full effective rotation of the said (001) major surface of the diamond material being achieved we mean that the side of the said (001) major surface bounded in the starting substrate by the at least one <100> edge is bounded in the grown substrate by two orthogonal <110> edges which intersect each other, and which encompass and replace the whole of the edge originally defined by the at least one <100> edge. This is exemplified below with reference to rectangular and triangular starting substrates.

In a preferred embodiment of the invention, the said (001) major surface of the diamond substrate has two adjacent and intersecting <100> edges, and full effective rotation of the said (001) major surface of the diamond material results in the formation of three <110> edges which encompass and replace the two <100> edges, two of the <110> edges being parallel to each other, and orthogonal to the third <110> edge. The third <110> edge lies between them and, when projected onto the plane defined by the original first substrate major growth face, either touches the point of intersection of the original <100> edges or is displaced laterally outwards from that point of intersection by lateral growth.

In another preferred embodiment of the invention the said (001) major surface is bounded in the first substrate solely by four <100> edges, and full effective rotation of the said (001) major surface of the diamond material results in the formation of four <110> edges, in the form of two parallel pairs which are orthogonal to one another, which encompass all four <100> edges of the first substrate. Each <110> edge, when projected on the plane defined by the original substrate major growth face, either touches a respective one of the four points of intersection of the original <100> edges (the corners of the growth face of the substrate) or is displaced laterally outwards from those points of intersection by lateral growth, forming a final grown diamond material which has have a major grown surface that is essentially square.

As used herein, the terms <100> edge and <110> edge include edges that are exactly <100> and <110> edges respectively, which are advantageous, and also edges that are up to 15°, preferably up to 10°, more preferably up to 6°, more preferably up to 3°, of the <100> and <110> directions respectively.

This achievement of full effective rotation of the said major surface of the diamond material in the preferred embodiment is a departure from the prior art process described in U.S. Pat. No. 6,096,129, not only because the first diamond substrate has a higher aspect ratio as described herein, but also because in the process described in that prior art publication, full effective rotation, which is not an objective in the prior art, does not occur. It does not occur due to the encroachment of {111} faces onto the major (001) face in the grown diamond material.

In preferred methods according to the invention, the grown diamond material has a (001) major surface with an area that is at least 200%, more preferably 220%, more preferably least 250%, more preferably 270%, even more preferably 300% of the area of the said major surface of the (001) major surface of the first substrate.

In some embodiments according to the invention the first diamond substrate used in the method according to the first aspect of the invention is substantially rectangular, preferably having an aspect ratio at least 1.3:1, or exceeding 1.3:1. That is the first substrate is rectangular having sides a, b where a/b≥1.3. For certain embodiments according to the invention the first diamond substrate may be substantially rectangular having an aspect ratio which preferably exceeds 1.5:1, or exceeds 1.7:1, or exceeds 2:1, or exceeds 2.5:1, or exceeds 3:1, or exceeds 4:1, or exceeds 5:1.

For embodiments where the first substrate is rectangular, the major surface of the substrate is preferably a {001} major surface, especially a (001) major surface, preferably with <100> edges.

In other embodiments according to the invention, the first diamond substrate is substantially triangular, and preferably presents a (001) major surface. Preferably the substantially triangular major surface is a right angled triangle which is preferably bounded by at least one <100> edge and one <110> edge, more preferably by one <100> edge and two <110> edges, or by two <100> edges and one <110> edge.

In preferred embodiments, where full effective rotation occurs for a substantially rectangular first substrate, for example for a substrate with edges parallel to [100] and and lateral dimensions of a×b (where a is greater than b), "full effective rotation" is achieved when sufficient lateral diamond material growth has occurred in the (001) growth sector such that the grown diamond material has a (001) upper surface that is substantially square in cross section, the axes of symmetry of the (001) upper surface of the grown diamond material being rotated by an angle of 45° relative to the axes of symmetry of the rectangular (001) major surface of the first substrate. For these preferred embodiments, at full effective rotation, the square (001) upper surface of the grown diamond material is bounded by edges parallel to the [110] and [1$\bar{1}$0] directions, and, by geometry can be calculated to have lateral dimensions of $(a+b)/\sqrt{2} \times (a+b)/\sqrt{2}$ The first substrate is typically a natural diamond or a HPHT synthesised diamond material, although it may also be CVD diamond material. Such substrates in the form commercially available may be uneven or irregular in shape. For example for a HPHT synthesised diamond material (which is commonly manufactured to be approximately square in shape) it is common for one or more corners of the HPHT synthesised diamond material to be damaged or even missing. These unevenly or irregularly shaped natural or synthetic diamond materials may be used to provide suitable first substrates for the present invention by first cutting out a regularly shaped part from the initial unevenly shaped part. A preferred embodiment of the invention therefore comprises the initial step of providing a precursor diamond substrate, for example an unevenly shaped diamond substrate, having an (001) major surface, and cutting the unevenly shaped diamond substrate so as to form at least one <100> edge on the major (001) surface, and more preferably cutting an inscribed rectangular diamond substrate from the precursor diamond substrate, which inscribed rectangular substrate is cut to have <100> edges. By geometry it can be shown that the area of a square faced surface grown from a rectangular substrate of side lengths a and b is given by $0.5(a+b)^2$. Therefore this area is maximised when (a+b) is maximised. Therefore in a preferred embodiment according to the invention the inscribed rectangular substrate cut from the provided precursor (e.g. unevenly or irregularly shaped) substrate is cut to maximise the value of a+b, where a and b are respectively the longer and shorter sides of the rectangular substrate, which cut inscribed rectangular substrate provides the said first diamond substrate in the method according to the first aspect of the present invention. It will be appreciated that only some, or all, of the sides of the precursor diamond substrate might need to be cut to provide the optimum inscribed rectangular substrate to be used as the first substrate in the present invention. Likewise for any three dimensional piece of diamond material which has not yet been prepared in the form of a plate, the preferred {100} surface selected to be formed, and which will form the (001) surface of the base substrate, is that which provides for the substrate with largest sum of dimensions a+b, where a and b represent dimensions of two orthogonal pairs of <100> edges wholly bounding the substrate major face. For example, this rule may be used to select the height up a diamond material where the major surface is formed.

Similarly, another preferred embodiment of the present invention comprises the initial step of providing a diamond substrate, for example an unevenly shaped diamond substrate, having an (001) major surface, and cutting an inscribed triangular diamond substrate from the precursor shaped diamond substrate, which cut inscribed triangular diamond substrate provides the said "first substrate" in the method according to the first aspect of the invention. The cut inscribed triangle is cut to have at least one <100> edge.

Thus the present invention makes it possible to use as starting material for CVD single crystal diamond material growth substrates that might hitherto have been discarded because the only square that could have been cut from that substrate would have been deemed too small to be useful. The ability to take an unevenly or irregularly shaped (001) plate and use it according to this invention results in a significant improvement in the utilisation of commercially available substrate material.

In other embodiments according to the invention uneven or irregular or even or regular shaped substrates e.g. square or rectangular substrates may be cut into any number of smaller regular shapes, e.g. into n equal rectangles or triangles, where n is greater than 1, greater than 2, greater than 3, etc, even as high as 8 or more, thereby generating "first substrates" as used in the method of the first aspect of the invention. Where these regular shapes are rectangles these preferably have aspect ratios greater than 2, 3 and even as high as 8. Where rectangular plates are cut these are preferably <100> edged. Where triangles are cut these preferably have at least one <100> edge and at least one <110> edge. Any combination of rectangles and triangles meeting these preferred edge requirements may be cut from a single substrate.

In preferred embodiments where n rectangular substrates are cut from a precursor substrate (where n>1), the cut rectangular substrates may be the same or different in size. One dimension of the cut substrates may be the same as, or smaller than, one dimension of the precursor substrate.

In preferred methods according to the invention each of the n rectangular substrates is used as a first substrate in a method according to the invention, and each grown diamond material has a major (001 surface) and the total area of the said major (001) surfaces of the n grown diamond materials is at least 20%, more preferably 50%, more preferably 100%, most preferably 200% over the area of a diamond material grown from the precursor substrate if uncut and grown to full effective rotation with a major (001) surface.

In certain embodiments according to the invention a square substrate of side length a is cut into n equal rectangular substrates where n>1, may be greater than 2 or 3, or even as high as 8, each rectangle preferably having a longer side length a and a shorter side length a/n, all edges of the growth surfaces preferably being <001>. Each cut rectangle provides a "first substrate" as used in the method of the first aspect of the invention.

In other embodiments according to the invention a square substrate of side length a is cut into unequal rectangular substrates, preferably with <001> edges, each cut rectangle providing a "first substrate" as used in the method of the first aspect of the invention.

The square substrate from which the regular shaped substrates, e.g. rectangular or triangular substrates are cut may be a commercially available diamond material, or may be a square faced diamond material grown by full effective rotation of another diamond material. Thus the invention envisages a "growth-cutting-growth" cycle for diamond material preparation.

An advantage of these embodiments in which a regular substrate is cut into two or more smaller regular shaped substrates is that it is possible to gain an increase in overall area of the grown CVD diamond plate compared to the area gain that would be achieved if the starting uncut substrate were used as the growth substrate.

A preferred embodiment according to the present invention comprises (a) cutting a section of diamond material from the lateral growth region of the grown single crystal diamond substrate (grown in a first synthesis step) so that the cut diamond material section provides a (001) surface with a <100> edge, and (b) (in a second synthesis step) growing diamond material homoepitaxially onto that (001) surface of the cut diamond section.

An advantage of this embodiment is that lateral growth tends to have significantly lower dislocation density than substrate growth (as described later in the specification), and consequently the diamond material grown from the cut lateral growth section also has low dislocation density, making it particularly suitable for applications where low defect density is desirable For example it is known that dislocations introduce strain which affects the optical homogeneity of material if used in an optical element. Also it is known that dislocations have associated traps in the band gap of a material which affects its intrinsic carrier properties, which means that diamond crystal grown with low defect density is particularly useful for electronics applications. In these preferred embodiments where a section is cut from the lateral growth in a first synthesis step for use in a second synthesis step, the cut lateral growth section is preferably triangular or rectangular.

Another embodiment according to the invention comprises placing two or more rectangular substrates each having a (001) major surface and at least on <100> edge adjacent to each other so as to provide a continuous <100> edge which exceeds the length of the longest <100> edge of either of the said two or more rectangular substrates. The adjacent substrates are said to be "tiled" substrates, and CVD growth from the tiled substrates takes place from the continuous <100> edge. The two or more substrates are preferably rectangular more preferably with an aspect ratio of at least 1.3:1. They are preferably placed end to end with their long edges aligned to provide the continuous <100> edge.

We have found that careful control of the processing parameters is advantageous in order to achieve full effective rotation from a first substrate having an aspect ratio of at least 1.3:1. One parameter that can be monitored in a CVD single crystal diamond material process, and is well understood in the art of diamond material synthesis by CVD, is the so called "α parameter". This parameter α is proportional to the ratio of the growth rate (GR) in the <001> direction to the growth rate in the <111> direction, and is defined as: $\alpha = \sqrt{3} \times (GR \text{ in } <001>) \div (GR \text{ in } <111>)$.

In preferred embodiments according to the invention the α parameter desired is preferably in the range 1.4 to 2.6, more preferably in the range 1.6 to 2.4, even more preferably in the range 1.8 to 2.2, and for some embodiments in the range 1.9 to 2.1.

In known CVD processes the α parameter is known to vary between <1 and >3, the value of α depending, inter alia, on the set of synthesis conditions in place, including the pressure, the temperature and the gas flow conditions and to a lesser extent details of parameters such as the CVD reactor vessel. It is known for α to be calculated after synthesis has been completed by making measurements on the as-grown diamond materials and using simple geometric relationships and crystallography to calculate α. It is also known in the art to make an 'α parameter map' of a particular synthesis reactor by measuring diamond materials grown under a range of pressure, temperature and gas composition combinations—again by post facto measurements. The methodology of characterising the alpha parameter for a given set of conditions is reported widely, however a particularly useful reference is Silva et al, Diamond & Related Materials, 18 (2009), 683-697. Silva et al describes how to select the temperature, gas pressure, power, and the process chemistry (e.g. the amount of methane, oxygen, nitrogen, hydrogen and argon gas etc) in order to achieve predetermined values of the α parameter, including values of α within our preferred range of 1.8 to 2.2. The exact values of each of these properties are specific to the reactors used by Silva (since, as known in the field, α is also reactor-dependent), but the skilled man can readily characterise any other reactor, and select appropriate values for each of the above properties using the teaching of Silva et al in order to achieve the desired α parameter.

According to the present invention, in preferred embodiments, we provide a synthesis process and synthesis reactor combination that is stable and has been sufficiently well characterised to be able to decide a priori that a particular value of α (or a narrow range of α values) can be specified before synthesis is started and crystals of the required α subsequently produced, so characterised according to methodology described in the Silva publication.

We have found that by tailoring the CVD synthesis conditions, for example by growing CVD diamond material with α in the above mentioned preferred range, the growth rate in the [001] direction is just high enough compared with the growth rate in the <111> direction substantially to prevent the formation of {111} facets immediately below and adjacent to the main (001) growth surface, and just low enough substantially to prevent the main (001) growth surface itself becoming unstable and forming hillocks and/or other damaging features. We have found that, all other things being equal, if α is above the preferred limits {111} facets form and may twin such that the twins encroach on the main (001) growth face and thereby hinder or stop any further increase in the lateral dimensions of the grown crystal. Similarly we have found that, all other things being equal, if α is below the preferred limits the lateral growth is limited and the smooth growth on the (001) surface is lost.

Single crystal diamond material grown by methods according to the invention will have two distinct regions, the lateral growth region and the substrate growth region, as defined hereinbefore. We have observed that these two distinct regions can be differentiated by their concentration of extended defects, the lateral growth region generally containing a much lower concentration of extended defects than the substrate growth region. By the term "extended defect" we mean a defect such as one or more dislocations, which originates at a point (typically in or at the surface of the first substrate) and then extends into the growing crystal (typically in approximately the growth direction). The relative proportions of extended defects in the two regions can be deduced by techniques such as measurement of the electronic properties, birefringence measurements, etching techniques and other optical techniques that allow defect densities to be compared. The difference in the density of extended defects in the lateral and growth regions is thought to be because in diamond material dislocations typically run in or close to the <100> growth directions. Since in the lateral growth region there is no substrate directly beneath it to provide a surface for dislocations to propagate in the <100> growth direction, the lateral growth region has improved crystallinity (lower dislocation density) than the substrate growth region (which grows directly above the substrate).

In addition, we have observed that the lateral and substrate growth regions are generally separated by a higher density of dislocations than occurs elsewhere in the grown crystal. It is believed that this higher density of dislocations originate from the edges of the original substrate. The high density region may be identified by techniques such as birefringence, characterisation of optical birefringence using instruments such as "Metripol" (Oxford Cryosystems UK), transmission electron microscopy (TEM) and X-ray topography.

By way of example it has been found that the dislocation density in the CVD diamond material in the substrate growth region is typically in the range $10^3$-$10^5$ cm$^{-2}$, whereas that in the lateral growth region may be <500 cm$^{-2}$. In the vicinity of the boundary between the substrate growth region and the lateral growth region, the dislocation density is typically in the range $10^3$-$10^6$ cm$^{-2}$, and is typically up to about ten to a hundred times higher than in the adjacent substrate growth region.

A substantially square grown CVD diamond material or indeed any diamond substrate cut from a grown CVD diamond material that has been grown from a first substrate with a <100> edge and an aspect ratio (as hereinbefore defined) of at least 1.3:1, particularly one which incorporates such an array of dislocations in an arrangement corresponding to the shape of the growth surface of the first substrate, indicating CVD growth from a first substrate with <100> edge and an aspect ratio (as hereinbefore defined) of at least 1.3:1 is considered novel per se.

A second aspect of the present invention provides a grown diamond material having a substantially square grown surface that has been grown by a CVD process from an (001) major surface of a first diamond substrate, the (001) major surface of the first diamond substrate having been bounded by at least one <100> edge, the length of that said at least one <100> edge exceeding any dimension (of the surface) that was orthogonal to the said at least one <100> edge by a ratio of at least 1.3:1.

Typically the grown diamond material includes dislocations. These typically nucleate at the edges of the growth surface of the first diamond substrate, and propagate through the diamond material in the growth direction, i.e. in a substantially <001> direction. Therefore there exists in the grown diamond a plurality of rows of dislocations extending in a substantially <001> direction. These rows of dislocations therefore present a record in the grown diamond of the outline of the starting substrate. Typically dislocations will nucleate at some but not all points along the edges of the growth surface of the first diamond substrate. There may be sections with no dislocations, and sections with a number of dislocations. In view of the starting orientation of the first substrate these dislocations typically extend in rows in generally (100) and (010) planes, or planes within 15° of those planes. When projected onto an (001) plane each row of dislocations presents a point, and if these points are joined they generate a line or lines (or a length of lengths) in the direction of the edge(s) of the first diamond substrate. Thus the lines so formed are in the shape and size of the outline of the growth surface of the first diamond substrate.

When we say in this specification that the line or lines (length or lengths) generated by joining the points (which are the projections of the rows of dislocations onto a (001) plane) defined the outline of the growth surface, we include the possibility that the lines do not actually intersect, but are extended to intersect each other. It may be the case, for example, that there is no row of dislocations propagating up from one or more corners of the first substrate, and in this case the lines (lengths) are extended to intersect, and thus define the outline of the corner(s). Typically any line joining the points along any side of the substrate will extend along at least 50%, preferably along at least 60%, or 70% or 80% of the length of the side of the first substrate.

In one embodiment the grown diamond material is grown from a first diamond substrate which had a rectangular surface with an aspect ratio of at least 1.3:1, and the grown diamond substrate includes a plurality of rows of dislocations, each typically extending in a generally <001> direction, or within 15°, or within 10°, or within 6°, or within 3° of that direction, which when projected onto a (001) plane present points, which if joined produce two pairs of parallel lines or lengths which form a rectangle, this rectangle being a record of the position of the edges of the first diamond substrate, from which edges the rows of dislocations have nucleated.

In another embodiment a grown diamond substrate is one grown from a first diamond substrate which had a triangular surface (preferably a right angled triangular surface) with at least one <100> edge, the length of the said at least one <100> edge exceeding any dimension of the surface that was orthogonal to the said at least one <100> edge by a ratio of at least 1.3:1, and the grown diamond substrate includes a plurality of rows of dislocations, each typically extending in a <001> direction, or within 15°, 10°, 6°, or 3° of that direction, which when projected onto a (001) plane present points, which if joined produce lines that intersect to form a triangle, this triangle being a record of the position of the edges of the first diamond substrate, from which edges the rows of dislocations have nucleated.

As described above, the position of the dislocations can be ascertained by known techniques.

A grown CVD diamond including these rows of dislocations which act as a record of the edges of the starting substrate, this record indicating that the starting substrate had an aspect ratio (as hereinbefore discussed) of at least 1.3:1 is new per se.

A third aspect of the present invention provides a grown CVD diamond material containing a plurality of rows of dislocations, each row extending in a substantially <001> direction, each row of dislocations when projected onto a (001) plane defining a point, and the points (from respective rows of dislocations) when joined defining a first length extending in the <100> direction and a second length extending in either a <001> direction or a <110> direction, the ratio of the first length to the second length, or vice versa, being at least 1.3:1, or it may exceed 1.3:1, or exceed 1.5:1, or exceed 1.7:1, or exceed 2:1, or exceed 2.5:1, or exceed 3:1, or exceed 4:1, or even exceed 5:1.

In certain embodiments each row of dislocations when projected onto a (001) plane defines a point, the points (from respective rows of dislocations) when joined defining four lengths extending in a <100> direction, the lengths forming a rectangles In other embodiments according to the invention each row of dislocations when projected onto a (001) plane defines a point, the points (from respective rows of dislocations) when joined defining two <100> lengths and a <011> length, or one <100> length and two <011> lengths, these lengths forming an isosceles right angled triangle.

Where reference is made to points joined to define one or more lines or lengths, these are linear straight lines drawn to be a best fit through the said points.

In preferred methods according to the invention, the thickness of the first substrate is typically in the range 0.2-1.2 mm, but it is not restricted to this range In preferred methods according to the invention the thickness of the grown diamond material is about half the length of the longest <100> edge in the starting substrate. Growth to that thickness corresponds to full rotation, as hereinbefore defined. However growth to higher or lower thicknesses may also be achieved, and may de desired for certain applications.

Preferred methods according to the invention produce a single crystal diamond plate, and the preferred methods comprise the step of processing the homoepitaxial CVD grown diamond material into a plate.

Embodiments of the invention will now be described, by way of example, with reference to the accompanying drawings, wherein:

FIG. 6a is an optical micrograph, taken in plan view, of a grown diamond crystal corresponding to the stage of growth shown in FIG. 2e;

FIG. 6b is a birefringence image of the section marked by dotted line Z in FIG. 6a, taken in plan view, after removal of the original base substrate;

FIG. 6c is an optical micrograph, taken in plan view, of another grown diamond crystal corresponding to the stage of growth shown in FIG. 2e;

FIG. 6d is an {008} X-ray topograph (XRT image) taken in plan orientation through the grown diamond crystal of FIG. 6c, after removal of the original base substrate;

FIGS. 7a to 7d and 8a to 8d are schematic representations showing different methods of increasing the overall area of grown diamond material using CVD diamond material growth methods according to the present invention.

Figure 1:
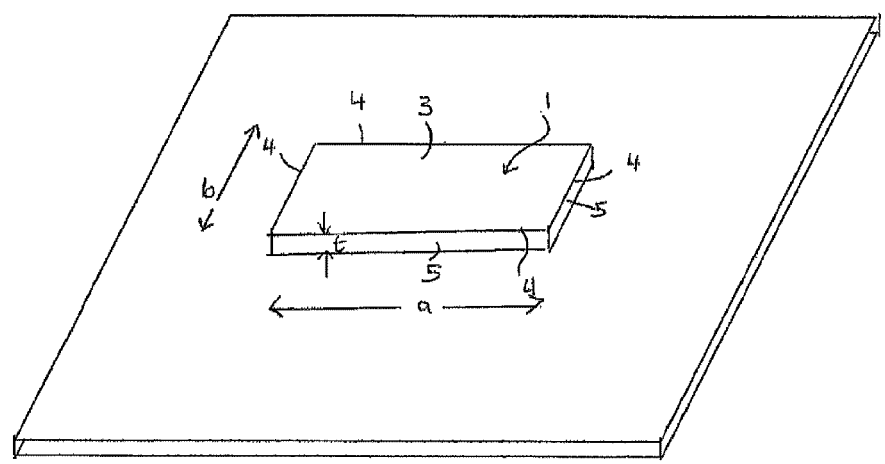
FIG. 1 is a perspective view showing a first diamond substrate suitable for use in methods according to the invention.

Referring to the drawings, FIG. 1 shows a first diamond substrate 1 suitable for use in methods according to the invention. The diamond substrate 1 is substantially rectangular having a length a, width b and thickness t, where a>b>t. The dimensions of the first diamond substrate 1 are: a=5 mm, b=1 mm, t=0.5 mm.

The diamond substrate 1 has a (001) major surface 3 which is bounded by <100> edges 4, and has four side {010} surfaces 5 (two of which are visible in FIG. 1). It is placed on a surface 7 comprising silicon, or any other suitable substrate as described hereinbefore, and placed in a CVD chamber under conditions described hereinafter with reference to the examples, and in particular under conditions where α (as hereinbefore defined) is in the range 1.9 to 2.1

During the CVD growth process the predominant single crystal growth is the (001) growth sector, i.e. growth from the (001) face 3, but there will also be some single crystal growth in the (100), (010) (−100) and (0-10) growth sectors, i.e. onto side surfaces 5. Furthermore there will be some competing polycrystalline growth originating from the tungsten surface 7.

As can be seen from FIGS. 2a-2d and FIGS. 3 and 4, the (001) growth sector of the grown diamond material extends not only normal to the (001) surface (i.e. parallel to the thickness t of substrate 1, and out of the paper as viewed in FIGS. 2a-2d) but also laterally.

Figure 2A:
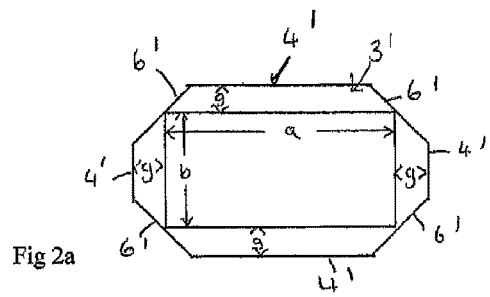
FIGS. 2a-2e are plan views showing sequential stages in the CVD growth process from the substrate of FIG. 1.

Growth of a <100> edge is significantly faster than growth of a <110> edge, therefore lateral growth continues from the <001> edges until the growing (001) surface presents a <110> edge. At the first stage as shown in FIG. 2a the (001) growth surface 3 has grown laterally outwards in the <100> directions so that the growth surface has an octagonal shape bounded by four <100> edges 4' and four <110> edges 6'. Therefore there are four regions of lateral growth (that portion of growth not directly above the original substrate face 3) which are all trapezoidal in shape, two along the long edges of the substrate 1 (referred to hereinafter as the "a edges") and two along the short sides of substrate 1 (referred to hereinafter as the "b edges"). The extent of lateral growth g is the same from all edges of the substrate 1.

Figure 2B:
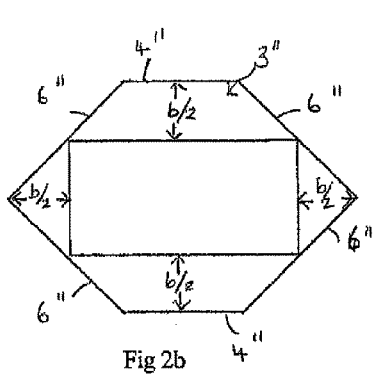

At the second stage of growth shown in FIG. 2b the growth surface has grown out laterally a distance equal to b/2 in all directions to form a growth surface 3" which is hexagonal in shape, bounded by four <110> edges 6" and two <100> edges 4". At this stage the b edges of the original substrate form regions of lateral growth that are shaped as right angled isosceles triangles bounded by the original b-edge of the substrate (which forms the hypotenuse of the triangle, and a pair of mutually perpendicular <110> directions. The distance from the right angle of this triangle to the mid-point of the h-edge is b/2. The a edges of the original substrate at this stage form trapezium shaped regions of lateral growth, b/2 in width and bounded by (i) the original <100> edges of the substrate, (ii) a <100> edge parallel to the original a-edge and (iii) a pair of <110 edges that are continuations of the <110> edges of the lateral growth on the b-edges. At this stage in the growth the area of the grown surface 3" is twice that of the original growth surface 3.

Figure 2C:
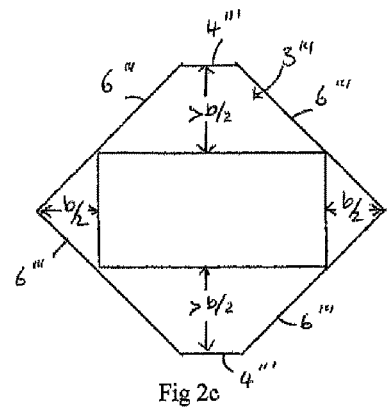

The next stage in the growth is shown in FIG. 2c. Since growth of <100> edges is significantly faster than growth of <110> edges, there is little further lateral growth from the short b edges, and instead the growth continues from the longer a-edges. This means that the growth surface 3''' is still hexagonal with two <100> edges 4''' and four <110> edges 6''', but the length of the <100> edges 4''' is shorter than the corresponding <100> edges of the surface 3" of FIG. 2b, while the length of the <110> edges 6''' is longer than the <110> edges 6" of FIG. 2b.

Having reached this stage any slow lateral growth from the <110> edges will typically be poor, and typically contain twinning. This twinned further growth is not shown in FIGS. 2c-2e, or in FIGS. 3-5, but is evident in later micrographs in FIG. 6 which are discussed later.

Figure 2D:
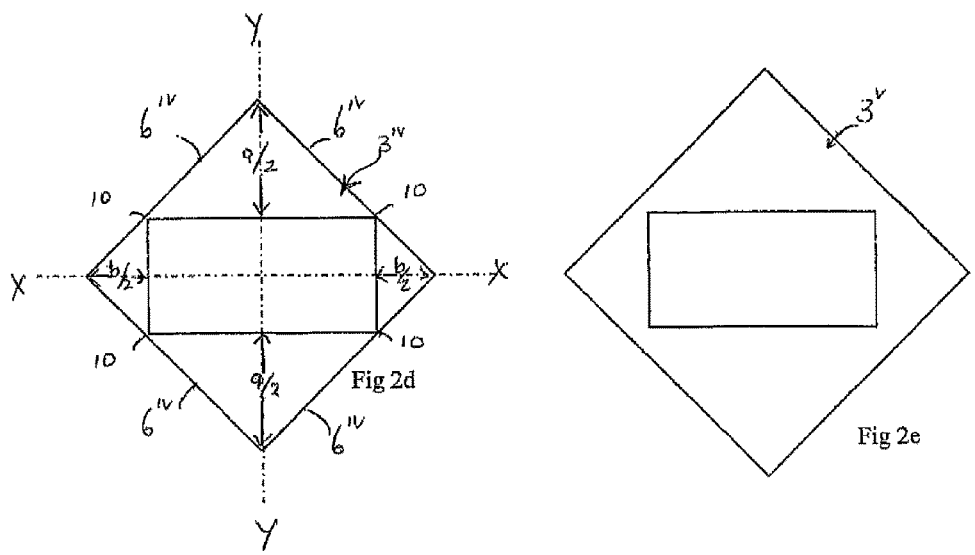
Figure 2E:
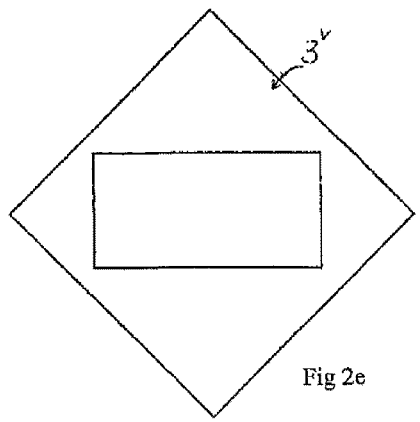

Growth continues in this way with the <110> edges lengthening and the <100> edges shortening until the <100> edges disappear altogether, and the respective pairs of the growing <110> edges intersect each other. At this stage, the grown surface presents a square $3^{iv}$ bounded by four <110> edges $6^{iv}$ as shown in FIG. 2d. Pairs of these <110> edges $6^{iv}$ intersect each other, and also lie in a (110) plane which intersects the said <100> edge 4 of the first substrate 1 at respective corners 10 of the said <100> edges of the first substrate 1. At the stage shown in FIG. 2d, "full effective rotation" of the growth surface is said to have taken place. The axes of the square growth surface $3^{iv}$ are rotated 45° relative to the axes of the growth surface 3 of the original substrate 1.

After the stage shown in FIG. 2d further growth depends on growth from a <110> edge which is significantly slower than from a <100> edge. However provided synthesis conditions are optimised, further lateral growth, albeit slow, may be achieved, with growth occurring at the same rate from each <110> edge so that the growth surface $3^v$ continues to be square in shape (see FIG. 2e) with axes coincident with the axes of the square growth surface $3^{iv}$ of FIG. 2d, i.e. no further rotation occurs. Thus with favourable conditions growth beyond the position of full effective rotation may be achieved.

Figure 3:
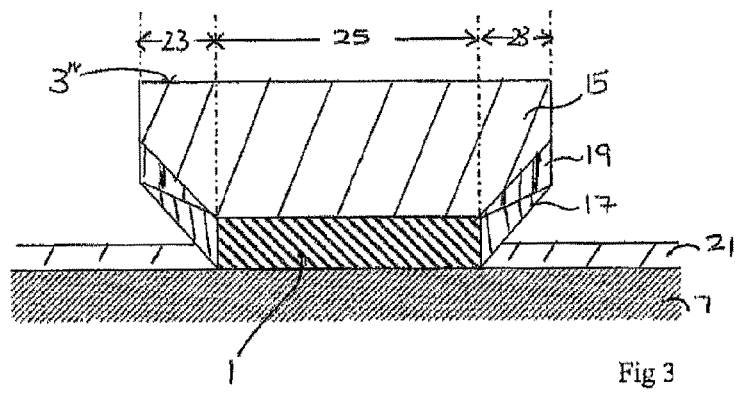
FIGS. 3 and 4 are cross-sectional views taken along lines X and Y respectively of FIG. 2d.
Figure 4:
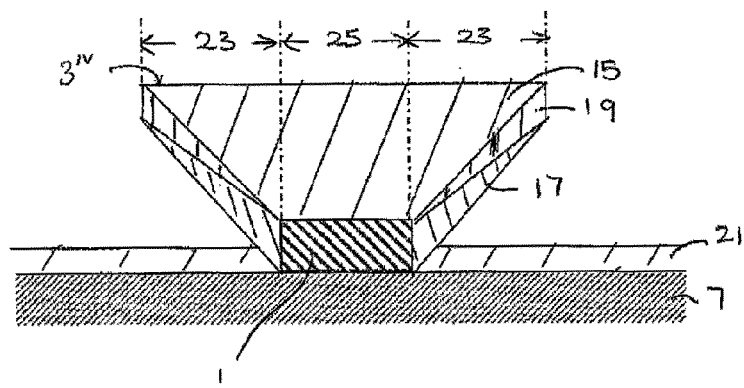

FIGS. 3 and 4 are cross-sectional views of FIG. 2d taken along X-X and Y-Y respectively. These show that there is single crystal growth from the (001) growth sector 15, from the (010) growth sector 17 (from the side faces 5 of the substrate 1) and from the (011) growth sector 19 (from the vertices of the substrate 1). Although the different single crystal diamond material growth sectors are hatched differently for clarity in the cross-sectional views, in reality they form a continuous crystal. This single crystal growth 15, 17, 19 meets polycrystalline growth 21 which comes from the substrate 7.

FIGS. 3 and 4 also illustrate the differentiation between the lateral growth region 23 and the vertical growth region 25 as defined in the present invention hereinbefore.

Figure 5:
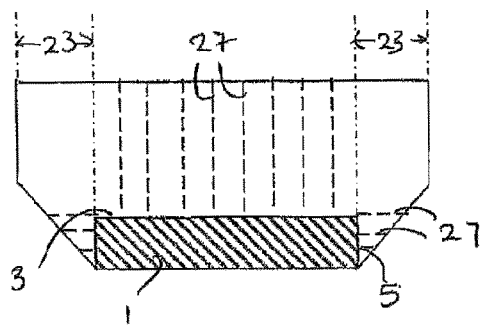
FIG. 5 is a schematic representation showing propagation of dislocations during the CVD diamond material growth process shown in FIGS. 2-4.

FIG. 5 is a schematic representation showing the positions where dislocations nucleating at or near the substrate surface 3 and 5 may generally occur. The dislocations position is indicated by dotted lines 27. Such dislocations can be rendered visible by a number of known techniques as discussed hereinbefore. It will be seen that there is a zone of lower dislocation density above the major (001) surface 3 of the starting diamond substrate 1, but outside the substrate edges, i.e. in the lateral growth region 23. Diamond plate cut from the lateral growth region 23 may advantageously be used for applications where a low dislocation density is desirable.

FIG. 6a is an optical micrograph taken in plan view of the grown diamond material. It corresponds to the stage of growth depicted in FIG. 2e discussed above, i.e. to a stage beyond full effective rotation. In FIG. 6a the first rectangular substrate 1 is still in place and visible, in the plan view micrograph, through the overlying transparent grown crystal. The CVD grown diamond material, which has grown beyond full effective rotation, presents a substantially square growth surface $3^v$ with four <110> edges $6^v$. These four <110> edges $6^v$ if projected down into the plane of the original growth surface of the first starting substrate 1, extend beyond the corners 10 of the first substrate 1. In FIG. 6a poorer growth, particularly twinned growth, 31 is also evident beyond the <110> edges 3$^v$.

FIG. 6b is a birefringence image, taken in plan orientation, through a rectangular section cut along the dotted lines Z in FIG. 6a, through the entire thickness of the grown CVD diamond material, but after removal of the first substrate 1. Birefringence techniques are used to indicate areas of strain in a crystal, areas of greater contrast indicating regions of greater strain, this strain being understood to correspond to regions of higher dislocation (or other defect) density.

FIG. 6b shows darker lines 33, which form a rectangular shape that corresponds to the shape of the original growth surface of the first substrate 1. These lines 33 are therefore evidence of planes extending through the thickness of the grown crystal up from the position of the edges of the original (but now removed) first substrate 1, which have a higher dislocation (or other defect) density than the surrounding regions of the grown crystal.

FIG. 6b also shows that the central region 35 within the rectangular array of lines 33 has more contrast than the outer regions 37 outside the rectangular array of lines 33. The central region 35 is "substrate growth" as hereinbefore defined and as represented by reference numeral 23 in FIGS. 3-5, while the outer region 37 is "lateral growth" as hereinbefore defined and as represented by reference numeral 25 in FIGS. 3-5. This difference in contrast between regions 35 and 37 in the grown crystal is evidence of the lower dislocation (or other defect) density associated with the lateral growth region of the diamond material compared with the substrate growth region of the diamond material.

FIG. 6c is as optical micrograph, taken in plan view, of another grown CVD diamond material, grown from a rectangular starting substrate, beyond full rotation. As in the grown diamond material of FIG. 6a the growth surface 3$^v$ of the grown diamond material is square with <110> edges 6$^v$, and the diamond material has grown just beyond full rotation. Again twinned regions 31 are evident beyond the <110> edges 6$^v$ of the grown diamond material.

FIG. 6d is an {008} XRT image taken through the grown CVD diamond material of FIG. 6c after removal of the first substrate 1. XRT (X-ray topography) is an alternative technique to birefringence imaging that may be used to indicate scattering power within a crystal and thereby reveal irregularities, such as dislocations or other defects. In XRT images regions of higher defect density show as regions of higher contrast. In FIG. 6d a dark rectangular line 39 is evident corresponding to the position of the edges of the growth surface of the starting substrate 1, which has now been removed. Rectangular line 39 is therefore evidence of planes of higher defect density extending up through the grown crystal from the original perimeter of the growth surface of the first substrate 1.

While the above embodiments shown in FIGS. 6a-6d show how evidence can be obtained illustrative of the growth history of a CVD grown diamond material it should be recognised that current or future methods might enable such dislocations or other defects to be removed. Therefore the absence in any birefringence or XRT image in a grown CVD diamond material of defects of the type described corresponding to the edges of the starting diamond substrate and/or to the substrate and lateral growth, does not necessarily mean that the method of the present invention has not been used to grow the single crystal diamond material.

The present invention is to be contrasted with the prior art reference described hereinbefore in which, due to the conditions used, {111} surfaces tended to form. Such surfaces have a higher propensity to twin and would limit the extent to which lateral growth is possible, the {111} surface encroaching on the grown surface.

As noted above a rectangular plate with lateral dimensions a×b with a top face (001) and side {100} faces grows outward a distance equal to b/2 to form a hexagonal shape (as shown with reference to FIG. 2b), i.e. to a shape where the shorter b edges have fully grown out, but one set of edges, the longer a edges, have not. Hitherto CVD diamond material growth has typically been carried out under conditions where the (001) growth surface is extremely stable, and under those conditions, starting with a rectangular substrate, twinning on the fully grown out {100} growth sector (i.e. on the {100} growth sector grown out from the short b edges) would occur, which would rapidly spread to the upper (001) surface thereby disrupting any further growth beyond the shape shown in FIG. 2b where one set of edges is fully grown out. In the past, since square starting substrates were used, the starting crystal was fully grown out in all lateral directions simultaneously, i.e. after a/2 growth, so the twinning problem did not arise. In the method according to the first aspect of the present invention, where the starting substrate is non-square, e.g. rectangular, all the edges do not grow out fully simultaneously, so with the conditions commonly used hitherto twinning would occur once the short <100> edges of the starting substrate were fully grown out to form <110> edges (FIG. 2b), and would disrupt any subsequent growth on the longer <100> edges. By appropriate selection of growth conditions, different to those typically used hitherto, we have advantageously managed to achieve stable growth beyond the b/2 distance so that not only the b edges, but also the a-edges, can fully grow out to yield a grown substrate with a shape as shown in FIG. 2d, or even FIG. 2e.

Figures 7A, 7B:
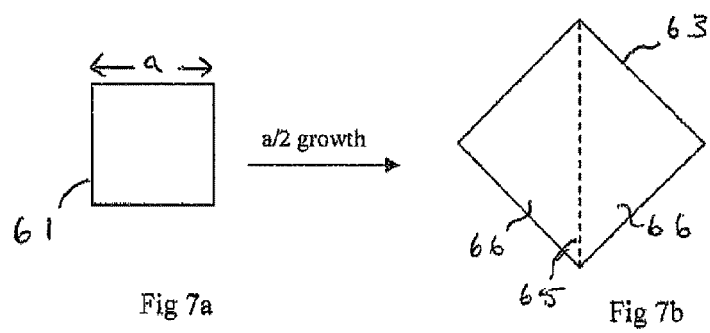
Figure 7C:
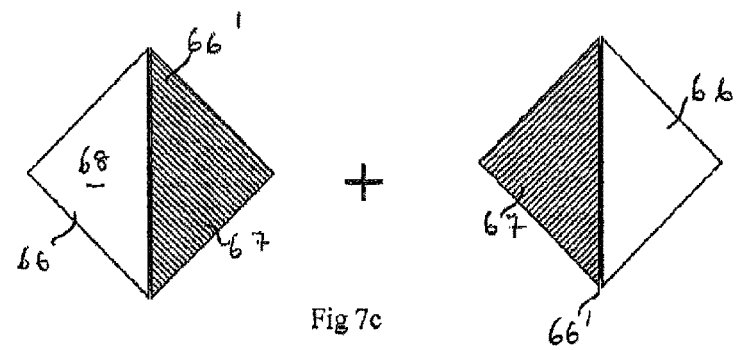
Figure 7D:
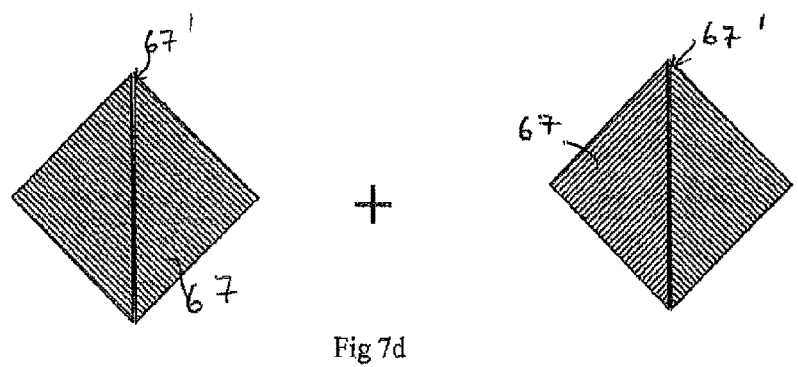

Referring to FIGS. 7a to 7c these show a square 61 with <100> edges of side "a" grown to a fully rotated square 63 with <110> edges (first stage of synthesis). The square 63 is cut along its <100> diagonal 65 (shown dashed in FIG. 7b) to form two right angled triangles 66 each with a <100> edge (the hypotenuse) and two other <110 sides. Each triangle 66 is then used as a source material to grow out from the <100> edge to full effective rotation to generate a crystal with a square face 66' bounded by <110> edges (second stage of synthesis). During the second stage of synthesis to the square shape 66' the triangular source substrates 66 each therefore grow laterally to general a triangular growth section 67. The triangular section 67 is all "lateral growth" as defined herein, and the triangular section 67 of lateral growth shares a hypotenuse with the triangular "substrate growth" section 68 which overlies the original substrate 66. The lateral growth section 67 and substrate growth section are in reality continuous single crystal, but the section 67, being all lateral growth will have significantly lower defect (e.g dislocation) density compared with substrate growth (as hereinbefore described with reference to FIG. 5). In a third stage of synthesis the low defect sections 67 can be cut off and used a starting substrate with a <100> edge from which at full effective rotation a crystal with a (001) square surface 67' can be grown. Since in this case the starting substrate 67 is a low defect region, then the substrate 67' grown at this third stage of synthesis will also contain a low number of defects. In the embodiments of FIG. 7 the area increase is 100% at each synthesis stage. An advantage of the embodiment described with reference to FIG. 7 is that it can produce large areas of diamond material with a low dislocation density. For clarity the areas of low or substantially no dislocation density are indicated by hatched shading in FIGS. 7c and 7d.

The embodiment of FIG. 7 relies on growth on three-sided substrates the triangular substrates having one <100> oriented side and two <110> oriented sides.

The three-sided substrates are shown in FIG. 7 to be sourced from originally square plates. They may alternatively be sourced from any other shaped plate. Similarly while the three sided substrates shown in FIG. 7 are isosceles triangles, other triangular shapes with triangles having differing length sides may be used.

In the embodiment shown in FIG. 8 a first stage of synthesis involves growth out from a square substrate 71 of side length "a", the square 71 having an (001) growth surface and <100> edges (FIG. 8a), lateral growth a distance a/2 occurring to achieve full effective rotation to form a square faced crystal 73 with <110> edges (FIG. 8b). That square is then cut along both its diagonals (as shown by dashed lines 75) to generate four triangular parts 77, each with two <100> edges and one <110> edge. For simplicity only one triangular part 77 is illustrated in FIG. 8c, but it will be appreciated that there would be three similar parts on which second and third synthesis growth could be achieved. In the second stage of synthesis each part 77 is then used to grow out a distance a/2 to generate rectangular parts 79 (FIG. 8c). The lateral growth from part 77 is two triangular shaped parts referenced 81 and 83 in FIG. 8c, and being all lateral growth parts 81 and 83 each contains significantly fewer dislocations than substrate growth regions. These regions of lower dislocation density are shown hatched in this Figure. The substrate growth is referenced 77' in FIG. 8c, and is not shown hatched because it is not a region of lower dislocation density. In a third synthesis stage parts 81 and 83 may be cut from the grown rectangle 79 and each grown out to full effective rotation, growing from their <100> edges to form substrates 84 and 84' with a square surface, triangular growth sections 85 and 87 being lateral growth from triangular substrates 81 and 83 respectively. Substrates 84 and 84' having started from lateral growth and generating lateral growth are both regions of lower dislocation density, as indicated by the hatched shading in FIG. 8d. The initial triangular substrate with its substrate overgrowth 77' can then be used to generate two further triangular growth sections 89 and 90 (FIG. 8c) These are again shown hatched since they are regions of lower dislocation density. Parts 89 and 90 could be cut off, and the process repeated. The embodiment shown in FIG. 8 shows a method of providing a theoretically infinite source of low dislocation density plates of CVD grown diamond material of intermediate size, starting from a single substrate 71.

It should be noted that where there are two sides that are <100> oriented, as in the example shown with reference to FIG. 8 then the growth time needed to get to the next stage is reduced relative to that where there is only one side that is <100> oriented (as in the embodiment in FIG. 7). This is because you make use of the fact that good growth is achieved on two faces at the same time.

Any combination of the preceding embodiments might be used. It would be obvious to those skilled in the art how these different examples might be combined to give different resulting products, and how certain resulting products might be particularly advantageous, e.g. of particularly enhanced individual area, or particularly enhanced overall area of a plurality of intermediate or small area substrates, and substantially dislocation free substrates.

The embodiments referred to above with reference to the drawings are generally described as being substrates with square corners separating two different <100> directions. In practise the invention applies to substrates where the two perpendicular <100> directions might be separated by a component of a second or more directions. For example a small section of <110>. Those skilled in the art would recognize that many of these concepts also apply to plates with predominantly <110> oriented edges, although the precise numeric increase in lateral area, as referred to with reference to several of the embodiments would be slightly modified by such geometric issues, as could be calculated by the man skilled in the art.

In the embodiments shown in the Figures it is assumed that the <100> growth rates in the plane of the paper are the same as the [001] growth rate perpendicular to the plane of the paper. In practice this may not be the case. For example, it has been found to be possible to grow crystals in which the lateral <100> growth rate is faster than the vertical [001] growth rate. These factors affect the growth time it takes for each of the individual synthesis stages shown in the illustrated examples. Where in the drawings a thickness (e.g. a/2) needed to grow to get to the next synthesis stage is indicated above the arrow that shows progress from one stage to the next, this thickness assumes conditions where the lateral <100> and vertical {001} growth rates are identical.

It is also assumed in the embodiments illustrated that the rotated growth continues only to the corners of the original substrate. In practice the growth could extend beyond the original corners of the substrate if conditions are good, although such further growth could be inhibited by the formation of {111} twins.

In order to achieve the area increase described preferred process parameters are desirable, e.g. temperature, gas pressure, power, process chemistry (amount of methane, nitrogen, hydrogen, oxygen, argon gas etc) etc, as discussed hereinbefore with reference to the α parameter. However, for certain applications, the most preferred process parameters for achieving the preferred area increase may not be preferred in terms of other desired properties of the grown crystal.

The invention will now be described further by way of the following non-limiting examples.

EXAMPLES

Example 1

Rectangular Substrate with All <100> Edges

A synthetic type 1b HPHT diamond plate with a pair of approximately parallel major faces within ~5° of (001) was selected. The plate was fabricated into a rectangular substrate suitable for homoepitaxial synthesis single crystal CVD diamond material by a process including the following steps:

i) laser cutting of the substrate to produce a plate with all <100> edges;

ii) lapping and polishing the major surface upon which growth is to occur, the lapped and polished part having dimensions about 5.0 mm×7.6 mm by 400 µm thick, with all faces {100}. The surface roughness $R_a$ at this stage was less than 10 nm over a measured area of at least 50×50 µm. The Ra (sometimes referred to as "RA" or "centre line average" or "c.l.a.") refers to the arithmetic mean of the absolute deviation of surface profile from the mean line measured by stylus profilometer, measured over a length of 0.08 mm, measured according to British Standard BS 1134 Part 1 and Part 2. The mathematical description of Ra (from "Tribology", I. M. Hutchings, Pub. Edward Arnold (London), 1992, pages 8-9) is:

$$R_a = \frac{1}{L}\int_0^L |y(x)| dx$$

(i.e. the arithmetic mean of the absolute deviation of surface profile measured by stylus profilometer, generally over 0.08 mm length). Measurement of Ra using a stylus profilometer is well known in the art and there are many instruments suitable for making such measurements; for example, the inventors have used a "Taylor Hobson FormTalysurf 50", (Taylor Hobson Ltd, Leicester, UK).

The substrate was mounted on a tungsten substrate carrier using a high temperature diamond material braze to proved a first substrate according to the method of the first aspect of the invention, as illustrated in FIG. 1. The substrate and its carrier were then introduced into a CVD reactor chamber and an etch and growth cycle commenced by feeding gasses into the chamber as follows:

First, an in situ oxygen plasma etch was performed at a pressure of 30260 Pa (230 Torr) and a substrate temperature of 787° C., followed by a hydrogen etch, oxygen being removed from the gas flow at this stage. Then the growth process was started by the addition of methane at 22 sccm (standard cubic centimetre per second) and dopant gases. Nitrogen and hydrogen were also present in the process gas. The substrate temperature at this stage was 827° C. Over the subsequent 24 hours the methane content was increased to 30 sccm. These growth conditions were selected to give an $\alpha$ parameter value in the range of 2.0±0.2, as measured retrospectively by crystallographic examination.

Study of the grown CVD diamond plate revealed near full rotation of the plate which was free of twins and cracks on the (001) face. Post-synthesis dimensions of the twin free top (001) face were 9.4 mm×9.4 mm and a CVD diamond material layer thickness of 2.3 mm. This process gave a plate 1.06 times greater than the expected 8.9 mm×8.9 mm which would be achieved at full effective rotation, as described for example with reference to the embodiment shown in FIG. 2d, as calculated from the formula $0.5(a+b)^2$. The percentage area increase over the original substrate is 132%, compared with the predicted 100%, and therefore corresponds to growth beyond full effective rotation, in the manner described with reference to FIG. 2e above. Further, the top (001) surface of the sample was free of all twins and other defects right out to its edge.

Example 2

Rectangular Substrate with <110> Edges

A synthetic type 1b HPHT diamond plate was selected as a substrate following the same selection criteria as the plate in example 1. This plate was laser cut to give a plate consisting of four minor {110} side faces and two major {001} faces bounded by <110> edges. The plate was then lapped and polished in the same manner as the plate in Example 1. Using this method, a substrate with dimensions 6.38 mm×5.65 mm and 0.60 mm thick was prepared.

The substrate was mounted on a carrier using one of the principal {001} faces. This plate was introduced into the reactor where an etch and growth cycle commenced as described below:

First, an in situ oxygen plasma etch was performed at 21 kPa, followed by a hydrogen etch with simultaneous removal of the O2 from the gas flow. Then the growth process was commenced by the addition of methane, together with dopant gases. The methane was introduced at 40 sccm. Nitrogen and hydrogen were also present in the process gas. Over the subsequent 24 hours the methane content was increased up to 165 sccm. These growth conditions were selected to give an $\alpha$ parameter value in the range of 2.0±0.2. Growth under these conditions was continued for longer than 100 hours.

On completion of the growth period, the substrate was removed from the reactor and the CVD diamond plate removed from the substrate.

Study of the grown CVD diamond layer revealed a plate which was free of twins and cracks on the (001) growth face. Post-synthesis dimensions of the twin free top (001) face were 8.0 mm×6.4 mm and the CVD diamond layer thickness was 3.1 mm. This process gave a plate with percentage area increase over the original substrate of 42%, whereas the predicted increase in area over the original area was 0% (a (001) substrate with {110} side faces does not undergo "rotation" and so would not be expected to increase in area). The reason for the higher than predicted increase in area is thought to be because the growth was under conditions near $\alpha=2$. Indeed subsequent calculations of the $\alpha$ parameter from measurement of the grown crystal showed that the $\alpha$ parameter value was 2.3. Furthermore, the top (001) surface of the sample was unexpectedly free of all twins and other defects right out to its edge; normally (110) edge faces are prone to twinning which limits the growth in the vertical direction as twins encroach onto the top growth surface. It is believed that the near $\alpha=2$ growth conditions have allowed the maintenance of the fine balance between avoiding growth instabilities on the (001) growth surface and twin formation on the {110} side faces, as hereinbefore discussed.

Example 3

High Aspect Ratio Rectangular Substrates

Three synthetic type 1b HPHT diamond plates were selected and prepared for synthesis using the same selection criteria as for the previous examples. Each of the three plates used in this example had an aspect ratio greater than 3, as follows:

Plate 1 had dimensions 4.16 mm×0.88 mm (aspect ratio of 4.73) and a thickness of 0.51 mm.

Plate 2 had dimensions 3.89 mm×0.64 mm (aspect ratio of 6.08) and a thickness of 0.51 mm.

Plate 3 had dimensions 3.66 mm×0.97 mm (aspect ratio of 3.77) and a thickness of 0.61 mm.

These plates were laser cut, lapped and polished to give substrates with all {100} edge faces and {001} major faces, then the cut, lapped and polished substrates were mounted onto a suitable carrier and grown on during a number of different synthesis runs. The conditions were as far as possible identical. Once in the reactor an etch and growth cycle commenced. The etch conditions were the same as for Example 1. The growth conditions were the same as for example 1 except that the methane introduction was increased from 22 sccm to 34 sccm over approximately 70 hours. These growth conditions were selected to give an $\alpha$ parameter value in the range of 2.0±0.2.

After growth, study of the three CVD diamond layer revealed full rotation of the plates which were free of twins and cracks on the (001) growth face. Post-synthesis dimensions of the twin free top (001) face for the three plates were:

Plate 1—6.0 mm×6.0 mm and a CVD diamond layer thickness of 3.19 mm.

Plate 2—5.6 mm×5.6 mm and a CVD diamond layer thickness of 3.13 mm.

Plate 3—5.6 mm×5.6 mm and a CVD diamond layer thickness of 3.08 mm.

This process gave plates with dimensions much greater than the expected 3.56 mm×3.56 mm, 3.20 mm×3.20 mm, and 3.27 mm×3.27 mm for plates 1, 2, and 3 respectively, which would be achieved by full rotation of the starting substrates, as calculated from the formula [(a+b)/√2]. The percentage area increase over the original substrate area for each plate was as follows:

Plate 1—453% (predicted 250%)
Plate 2—642% (predicted 191%)
Plate 3—350% (predicted 201%)

The grown diamond material was measured and the alpha parameter values were calculated as 2.3, 2.2 and 2.3 for plates 1, 2 and 3, respectively. Further, the top (001) surfaces of all three samples were free of all twins and other defects right out to their edges.

Plate 1 of this example was processed to produce a 0.42 carat round brilliant cut synthetic gem stone.

The present invention further provides any novel feature or any novel combination of features hereinbefore described that a skilled reader would understand could be selected in combination.

The invention claimed is:

1. A grown CVD diamond material containing a plurality of rows of dislocations, each row extending in a substantially <001> direction, each row of dislocations when projected onto a (001) plane defining a point, and the points when joined defining a first length extending in a <100> direction, and a second length which intersects the said first line, and extends in either a <100> or a <110> direction, the ratio of the first length to the second length, or vice versa, being at least 1.3:1.

2. A grown CVD diamond material according to claim 1, wherein each row of dislocations when projected onto a (001) plane intersect defines a point, the points when joined defining four lengths extending in a <100> direction, the lengths forming a rectangle with an aspect ratio of at least 1.3:1.

3. A grown CVD diamond material according to claim 1, wherein each row of dislocations when projected onto a (001) plane defines a point, the points when joined defining two <100> lengths and a <011> length, or one <100> length and two <011> lengths, these lengths forming an isosceles right angled triangle.

4. A method of producing a grown single crystal diamond substrate comprising:
(a) providing a first diamond substrate which presents a (001) major surface, which major surface is bounded by at least one <100>edge, the length of the said at least one <100>edge exceeding any dimension of the surface that is orthogonal to the said at least one <100>edge by a ratio of at least 1.3:1; and
(b) growing diamond material homoepitaxially on the (001) major surface of the diamond material surface under chemical vapour deposition (CVD) synthesis conditions, the diamond material growing both normal to the major (001) surface, and laterally therefrom so as to produce a grown CVD diamond material containing a plurality of rows of dislocations, each row extending in a substantially <001>direction, each row of dislocations when projected onto a (001) plane defining a point, and the points when joined defining a first length extending in a <100>direction, and a second length which intersects the said first line, and extends in either a <100>or a <110>direction, the ratio of the first length to the second length, or vice versa, being at least 1.3:1.

5. A method according to claim 4, wherein the provided first diamond substrate presents a (001) major surface, which major surface is bounded by at least one <100>edge, and the method comprises growing diamond material homoepitaxially on the (001) major surface of the diamond material, growth being continued in one or more steps until there is a sufficient thickness of grown diamond material that the associated lateral growth of the diamond material is sufficiently great that full effective rotation of the said (001) major surface of the diamond material is achieved.

6. A method according to claim 4, wherein the grown diamond material has a (001) major surface with an area that is at least 200% of the area of the said major surface of the (001) major surface of the first substrate.

7. A method according to claim 6, wherein the grown diamond material has a (001) major surface with an area that is at least 220% of the area of the said major surface of the (001) major surface of the first substrate.

8. A method according to claim 4, wherein the starting diamond substrate presents a (001) major surface that is substantially rectangular.

9. A method according to claim 8, wherein the rectangular substrate is bounded by <100>edges.

10. A method according to claim 8, comprising the initial step of providing a precursor diamond substrate having an (001) major surface and cutting an inscribed rectangular diamond substrate from the precursor diamond substrate, which inscribed rectangular substrate is cut to have <100>edges, the cut inscribed rectangular substrate providing the said first diamond substrate.

11. A method according to claim 10, wherein the cut rectangle is cut to maximise the value of a+b, where a and b are respectively the longer and shorter sides of the rectangular substrate.

12. A method according to claim 10, comprising cutting n rectangular substrates from the precursor substrate where n>1.

13. A method according to claim 12, wherein each of the n rectangular substrates is used as a first diamond substrate, wherein each grown diamond material has a major (001) surface and wherein the total area of the said major (001) surfaces of the n grown diamond materials is at least 120% of the area of a diamond material grown from the precursor substrate if uncut and grown to full effective rotation with a major (001) surface.

14. A method according to claim 12, wherein the cut rectangular substrates are the same or different in size.

15. A method according to claim 8, comprising placing two or more rectangular substrates each having a (001) major surface and at least one <100>edge adjacent to each other so as to provide a continuous <100>edge which exceeds the length of the longest <100>edge of either of the said two or more rectangular substrates.

16. A method according to claim 4, wherein the first diamond substrate presents a (001) major surface that is substantially triangular.

17. A method according to claim 16, wherein the substantially triangular major surface is a right angled triangle that is bounded by one <100>edge and two <110>edges, or by two <100>edges and one <110>edge.

18. A method according to claim 4, comprising (a) cutting a section of diamond material from the lateral growth region of the grown single crystal diamond substrate so that the cut diamond section provides a (001) surface with a <100>edge, and (b) growing diamond material homoepitaxially onto that (001) surface of the cut diamond section.

19. A method according to claim 18, wherein the cut lateral growth section provides a substantially rectangular or triangular (001) surface.

20. A method according to claim 4, wherein during the CVD process the value of the a is in the range 1.4 to 2.6 where α=(√3 ×Growth rate in <001>)÷Growth rate in <111>.

21. A method according to claim 20, wherein a is in the range 1.8 to 2.2.

22. A method according to claim 4, for producing a single crystal diamond plate, comprising the step of processing the homoepitaxial CVD grown diamond material into a plate.

* * * * *